United States Patent
Foroudi et al.

(10) Patent No.: US 6,380,794 B1
(45) Date of Patent: Apr. 30, 2002

(54) HYBRID CIRCUIT HAVING CURRENT SOURCE CONTROLLED BY A COMPARATOR

(75) Inventors: Navid Foroudi; Bent Hessen-Schmidt, both of Ottawa (CA)

(73) Assignee: SiGe Microsystems Inc., Ottawa (*) Notice: Subject to any disclaimer, the term of this patent is extended or adjusted under 35 U.S.C. 154(b) by 0 days.

(21) Appl. No.: 09/534,522

(22) Filed: Mar. 24, 2000

(51) Int. Cl.[7] .............................................. H03K 17/60
(52) U.S. Cl. ...................... 327/433; 327/108; 327/563
(58) Field of Search ................................ 327/108, 109, 327/110, 111, 112, 433, 563, 387; 326/110, 68; 330/252, 253, 261

(56) References Cited

U.S. PATENT DOCUMENTS

| | | | |
|---|---|---|---|
| 5,144,173 A | * 9/1992 | Hui | 327/277 |
| 5,214,321 A | 5/1993 | Curtis | |
| 5,359,552 A | * 10/1994 | Dhong et al. | 327/530 |
| 5,610,539 A | 3/1997 | Blauschild et al. | |
| 5,739,703 A | * 4/1998 | Okamura | 326/110 |
| 5,914,630 A | * 6/1999 | Peterson | 327/563 |
| 5,917,360 A | * 6/1999 | Yasutake | 327/108 |
| 6,100,716 A | * 8/2000 | Adham et al. | 326/68 |

FOREIGN PATENT DOCUMENTS

| | | |
|---|---|---|
| EP | 0 561 099 | 9/1993 |
| EP | 0 875 997 | 11/1998 |
| WO | WO 99 35603 | 7/1999 |

\* cited by examiner

*Primary Examiner*—Matthew Smith
*Assistant Examiner*—Paul Dinh
(74) *Attorney, Agent, or Firm*—Freedman & Associates

(57) ABSTRACT

A current mode logic circuit having npn transistors coupled to an NMOS current source provides a substantially constant current when controlled by an opamp comparator. A gate of the NMOS current source is directly coupled to an output terminal of the opamp. A source of the NMOS transistor is connected to one of the inputs of the comparator opamp. Another input terminal is connected to voltage source. The opamp compares the two inputs and provides an output signal which ensures that the opamp will provide a substantially constant current source.

18 Claims, 4 Drawing Sheets

HYBRID CIRCUIT HAVING CURRENT SOURCE CONTROLLED BY A COMPARATOR

FIELD OF THE INVENTION

This invention relates generally to a circuit having a mixed topology of NPN transistors and a CMOS transistor controlled by an opamp to provide a substantially constant sinking current source.

BACKGROUND OF THE INVENTION

Current-mode logic (CML) circuitry, such as shown in Colace, Electronic Product Design, January 1986, pages 43–46; Millman et al, "Pulse Digital, and Switching Waveforms", McGraw, Hill Book Company, New York, 1965, pages 358–359; and Hamilton et al "Basic Integrated Circuit Engineering", McGraw-Hill Book Company, New York, 1975, pages 492–497, offers high speed, but the required stacking of logic levels limits performance when low voltage supply operation is necessary.

Two common forms of CML that are used include a multi-level CML shown in prior art FIG. 1 and a single-ended version shown in prior art FIG. 2. The multi-level CML of FIG. 1 is differential, but requires different logic levels for inputs A, Abar and B, Bbar. Emitter followers can be used to translate from the top level to the bottom level as shown in FIG. 1.

The current-mode logic (CML), illustrated in FIG. 1, offers high speed, but the required stacking of logic levels limits performance. This performance limitation is especially noticeable when a low voltage supply operation is necessary.

The single-ended logic version shown in FIG. 2 operates with a reference voltage, V.sub.REF. This circuitry shows single-ended logic, which is much simpler, but the lack of differential signal paths makes the logic more susceptible to noise, especially from the voltage supply. This problem is aggravated in the case of high-speed logic in which small signal-swings are required.

A two-differential input conventional current mode logic circuit used in high speed switching logic gates typically requires a supply voltage of at least 2.7 volts in order to perform its associated logic functions. The benefit of using CML is its fast response time resulting from its small differential voltage between differential outputs. Notwithstanding, if the differential pairs of transistors are to operate within a high speed-switching regime, there is a minimum voltage that the transistors require across their respective collectors and emitters in order to operate outside the saturation region. In a CML system, signaling output transistors are arranged and mutually connected as a differentiating pair, with a common current source connected to "0" potential or earth potential. The NPN current source that is typically used lessens available "head-room" between the current source and the supply voltage and thereby increases the requirement for a high enough supply voltage.

An aspect of this invention satisfies a need for provding CML circuits that can operate with a minimum supply voltage of approximately 2.0 volts at 25° C.

A conventional current source comprising an NPN transistor having a degeneration resistor coupled between the emitter of the NPN transistor and ground and having a feedback circuit comprising a low power opamp, generally requires a voltage of approximately 800 mV between the collector and emitter to ensure that the transistor will not operate in saturation. If the voltage drops to below 500 mV the base current required increases substantially thereby placing demands on the low-power opamp to provide the required current. Therefore, although an NPN current source of this type can operate with a voltage of above 500 mV and below 800 mV across its collector emitter, it is preferred to ensure that the voltage is at or above 800 mV at all times so that the transistor does not go into a soft saturation mode of operation.

The prior art circuit shown in FIG. 3 having only a resistor replacing a conventional current source attempts to provide a solution to lessening the supply voltage requirement of a CML circuit by obviating the requirement for providing the necessary voltage across the collector emitter of an NPN transistor in a sinking current source. With the elimination of the bipolar junction transistor, the supply voltage requirement is substantially lessened, however other unwanted limitations are introduced. The absence of an NPN transistor in this circuit lessens the maximum supply voltage level required by 0.5 to 0.8 volts, however as the supply voltage increases, the current flowing through the circuit increases and the voltage difference between the differential transistor pairs increases; furthermore, one of the transistors of the differential pair goes into saturation due to the increased voltage across its respective load resistor. Operation in saturation results in a lower speed device.

In view of this, it is desired to have a current source that ensures a fixed amount of current, within predetermined limits while, requiring less voltage than conventional NPN current sources require.

In addition to CML circuits, this invention can be used to manufacture an analog signal mixer with a lower supply voltage than has customarily been provided.

It is an object of this invention to provide a CML circuit having at least a first pair of BJT differential transistors serially coupled to at least one of a second pair of BJT differential transistors, and wherein the supply voltage level required is below or substantially about 2.3 volts.

It is an object of this invention to provide a controller for ensuring a substantially constant current source for operation of a CML circuit.

SUMMARY OF THE INVENTION

An embodiment of the present invention is directed to logic circuitry which comprises a multiple input stage having a plurality of BJT gates disposed serially coupled to a common CMOS current source.

In accordance with the invention, there is provided, a current mode BiCMOS circuit comprising: an input stage having a plurality of electrically coupled NPN bipolar junction transistors coupled with a sinking current source having an NMOS transistor having a source terminal coupled to a ground terminal through a load resistor; and, an op-amp for controlling the NMOS transistor to ensure a substantially constant current source.

In particular, the circuitry of the present invention may comprise a number NPN input transistors coupled to and NMOS current source having a feedback circuit for ensuring a current passing therethrough is substantially non-varying.

BRIEF DESCRIPTION OF THE DRAWINGS

Exemplary embodiments of the invention will now be described in conjunction with the drawings in which.

DETAILED DESCRIPTION

Figure 1:
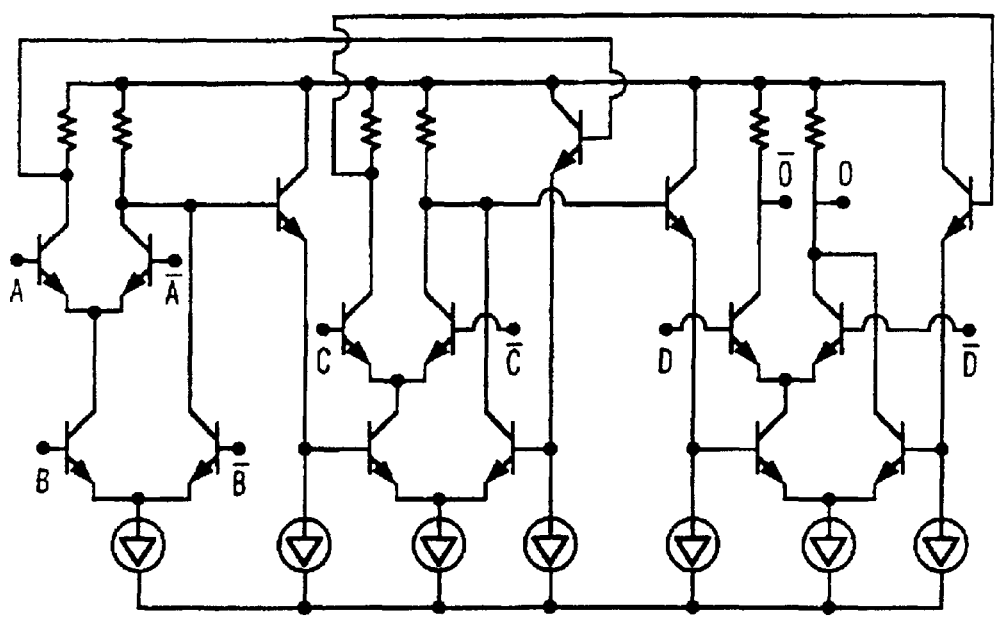
FIG. 1 is a schematic circuit diagram of a prior art circuit having serially connected logic gates formed of NPN bipolar junction transistors.
Figure 1A:
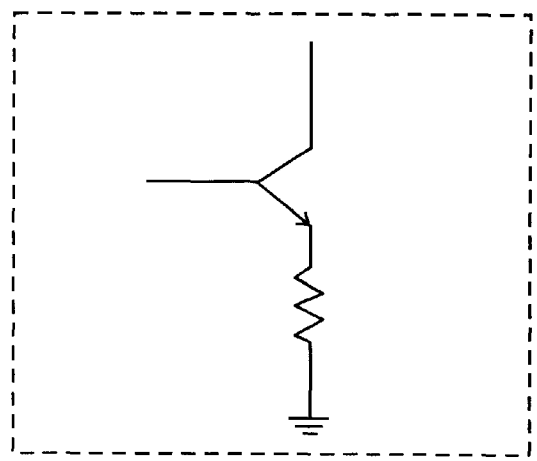
FIG. 1A is an enlarged detailed view of a current source shown in FIG. 1.
Figure 2:
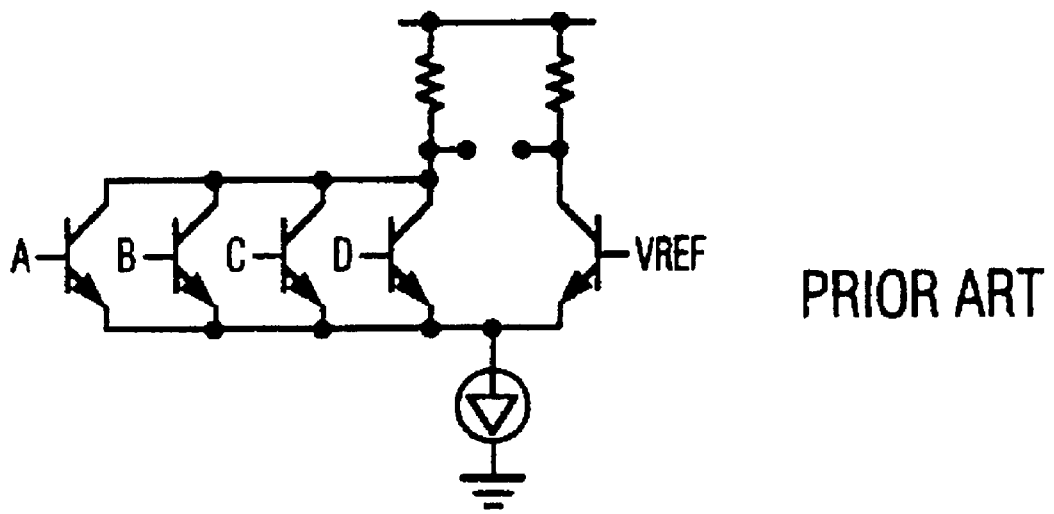
FIG. 2 is a schematic circuit diagram of an alternative embodiment of a prior art logic circuit which has a parallel configuration, instead of the serial configuration shown in FIG. 1.
Figure 3:
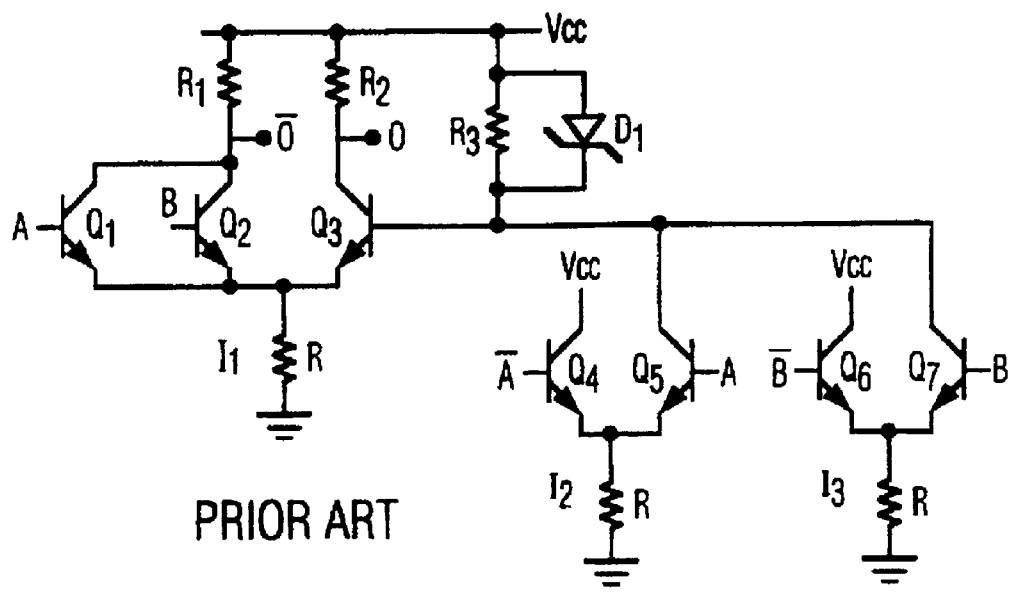
FIG. 3 is a circuit diagram of a prior art CML circuit wherein a resistor replaces a conventional current source.
Figure 4:
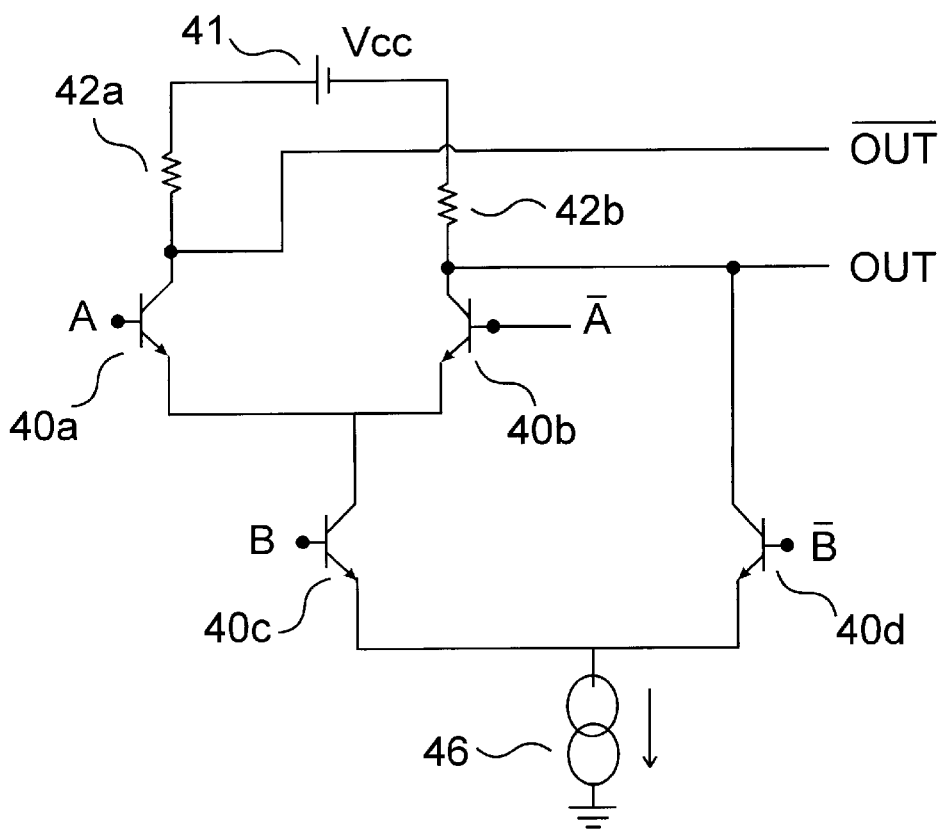
FIG. 4 is a schematic diagram of a CML circuit in accordance with this invention.

Turning now to FIG. 4, a CML circuit is shown in accordance with an embodiment of this invention wherein transistors 40a, 40b, 40c, and 40d having corresponding input base terminals A, Abar and B, Bbar are configured to form an AND logic gate. A voltage supply Vcc is connected to a voltage supply terminal 41 at an upper end of the circuit. NPN transistors 40a and 40b are pulled high by way of a pull-up resistors 42a and 42b connected to the supply voltage Vcc and the collectors of NPN transistors 40a and 40b. The emitters of transistors 40a and 40b are joined and are electrically connected to the collector of transistor 40c. The collector of transistor 40d is electrically coupled to the collector terminal of NPN transistor 40b. Both of the emitters of the transistors 40c and 40d are connected to a current source 46, which has a lower voltage drop across it than would a conventional NPN current source.

Figure 5:
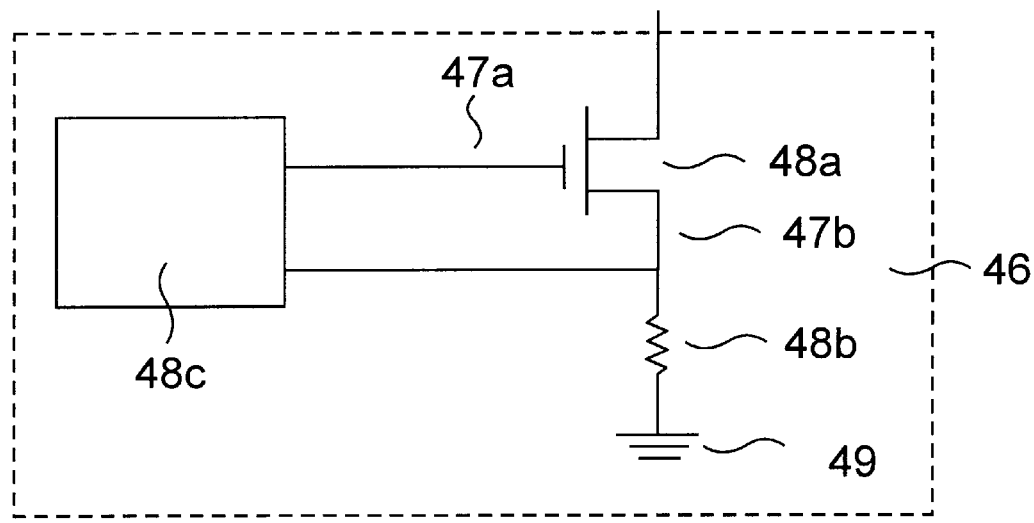
FIG. 5 is a detailed schematic diagram of a current source used in the FIG. 4 in accordance with this invention; and, FIG. 6. is a detailed schematic diagram showing feedback circuitry used to control the current source shown in FIG. 5 so that a substantially constant current flows therethrough.
Figure 6:
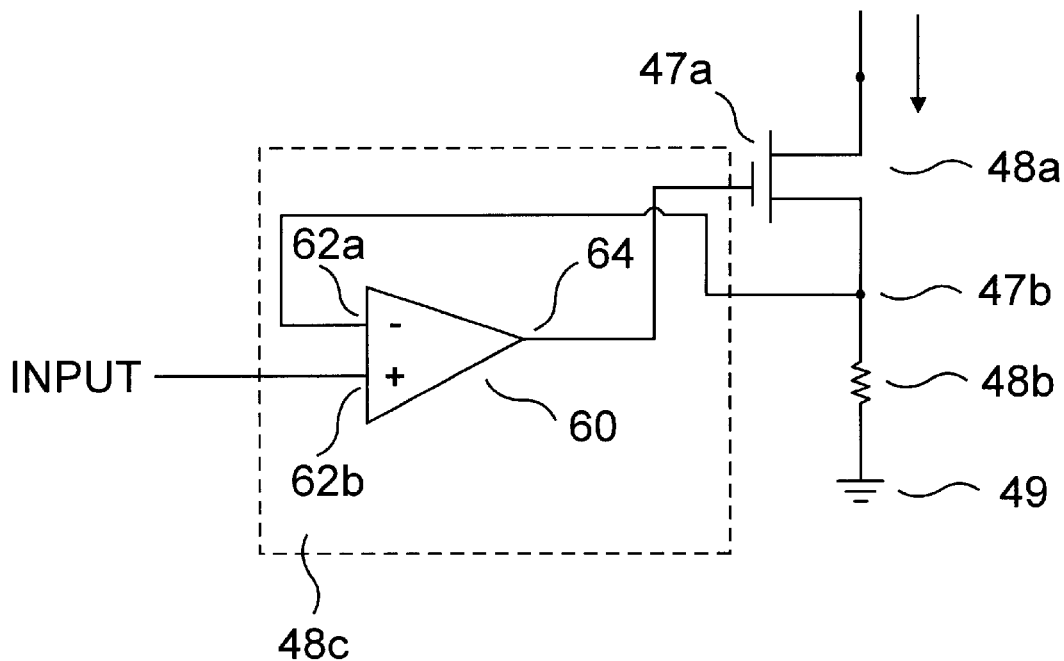

Turning now to FIG. 5, the current source 46 is shown in more detail consisting of an NMOS transistor 48a having a feedback circuit 48c connected between the gate 47a and source 47b of the transistor 48a. A degeneration resistor 48b is connected between the source of transistor 48a and a ground terminal 49. The feedback circuit 48c is shown in more detail in FIG. 6 and consists of an opamp comparator 60 having an input terminal 62a connected to the source 47b of the NMOS transistor and having an output terminal 64 connected to the gate 47a. Another of the opamp input terminals 62b is biased at a fixed voltage; in this instance 0.1 volts.

Advantageously, since an NMOS transistor does not require its drain source voltage to be over 100 mV, an immediate advantage is gained by providing this stage in the circuit versus a conventional NPN current supply which would otherwise require as much as 800 mV from the supply voltage. Advantageously NMOS transistors function adequately when the drain-source voltage is low, for example 300 mV which would not be suitable for a bipolar transistor serving as a current source. In contrast with conventional NPN current sources if the voltage across the collector emitter drops by more than a desired amount, the base current increases, the transistor goes into saturation, and unwanted power demands are placed upon the low power opamp. By providing a hybrid circuit, which uses an NMOS device as a current source in a circuit which has the advantages of a NPN CML topology, a synergistic advantage is gleaned.

In operation, the negative feedback sinking current source ensures a substantially constant current through the degeneration resistor 48b. For example when the voltage at the source terminal of the NMOS transistor increases above 0.1 volts present at the positive input terminal 62b of the opamp, the output terminal of the opamp outputs a reduced voltage than 0.1 volts, which in turn reduces the source voltage thereby providing negative feedback. Conversely, if the voltage at the positive terminal lessens, the opamp ensures that the gate voltage increases accordingly thereby maintaining a substantially constant current.

Analyzing the operation of the circuit of FIG. 4 in more detail with consideration to the voltages at room temperature applied to various nodes follows: In the instance where a desired Vcc applied is 2.0 volts, the voltage at the higher of the base terminals of transistors 40a and 40b is 2.0 volts and the voltage at the collector of the transistor 40c is 1.15 volts. Consequently the voltage at the emitter of the same transistor and coincidently the drain of the NMOS transistor is at 0.3 volts; the gate 47a of the NMOS transistor is by way of example biased at 0.9 volts. By providing a resistance value for the degeneration resistor of 1kΩ a constant current of 100 μA passes through that resistor if 100 mV is applied to the positive input terminal of the opamp comparator.

Figure 7:
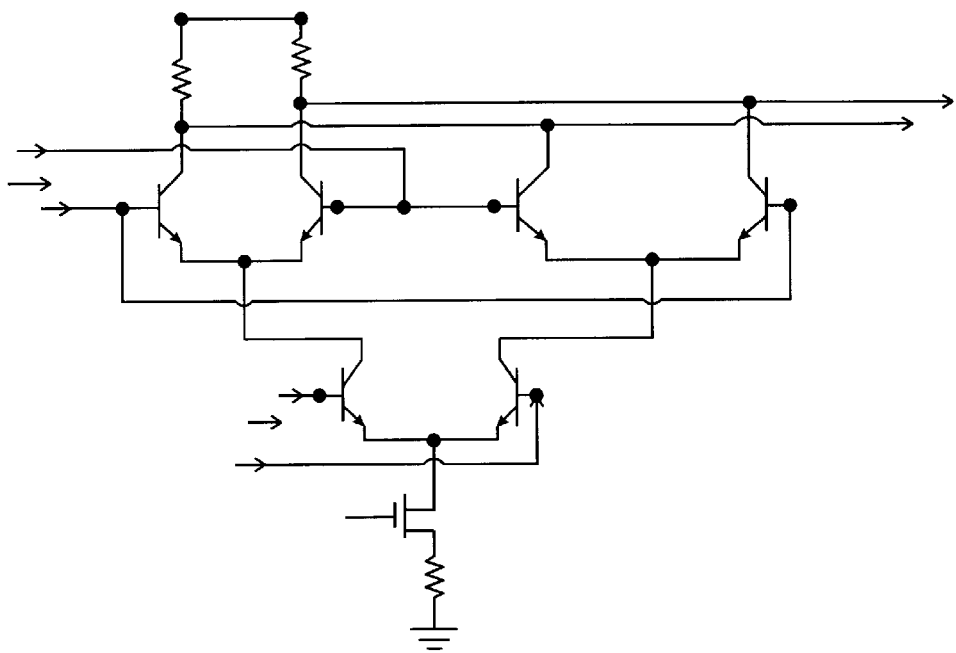
FIG. 7. is an alternate schematic diagram of a CML circuit.

The circuit described heretofore, is made using BiCMOS technology. Although the exemplary embodiment described heretofore relates to a current-mode logic circuit, FIG. 7 illustrates an alternative embodiment of a mixer is shown consisting of NPN bipolar junction transistors having an NMOS transistor controlled by an opamp as a current source. Similarly the advantage of providing additional headroom, i.e. requiring a lower supply voltage than a conventional NPN transistor current source requires is afforded.

Of course numerous other embodiments can be envisaged utilizing NPN differential amplifiers with an NMOS current sources without departing from the spirit and scope of the invention.

What is claimed is:

1. A current mode BiCMOS circuit comprising:

an input stage having a plurality of electrically coupled NPN bipolar junction transistors directly coupled with a sinking current source having an NMOS transistor coupled to a degeneration resistor wherein the NPN bipolar transistors and the NMOS transistor are, in use, absent a substantial voltage drop therebetween; and, a control circuit including a comparator for controlling the current that passes through the NMOS transistor.

2. A current mode BiCMOS circuit as defined in claim 1 wherein the plurality of NPN bipolar transistors includes a differential pair of transistors, and wherein emitters of the NPN differential pair of transistors are connected to a drain of the NMOS transistor.

3. A current mode BiCMOS circuit as defined in claim 2 wherein the comparator is an opamp and wherein an output terminal of the opamp is coupled to a gate of the NMOS transistor.

4. A current mode BiCMOS circuit as defined in claim 3 wherein the comparator is an opamp and wherein a negative input is directly coupled to a source of the NMOS transistor.

5. A current mode BiCMOS circuit as defined in claim 3 wherein a positive input terminal of the comparator is connected to a voltage source.

6. A current mode BiCMOS circuit as defined in claim 1, wherein the resistor has one terminal connected to a ground terminal and another terminal connected to a source terminal of the NMOS transistor.

7. A current mode BiCMOS circuit as defined in claim 1 wherein the comparator is an opamp.

8. A current mode BiCMOS circuit as defined in claim 1, wherein the sinking current source comprises a feedback circuit for providing a substantially constant current through the degeneration resistor when the circuit is in use.

9. A current mode BiCMOS circuit as defined in claim 8 wherein the feedback circuit is coupled to the gate and the source of the NMOS transistor.

10. A current mode BiCMOS circuit comprising:

an input stage having a plurality of electrically coupled NPN bipolar junction transistors directly coupled with a sinking current source having an NMOS transistor coupled to a degeneration resistor, and, a control circuit including a comparator for controlling the current that passes through the NMOS transistor, wherein the plurality of NPN bipolar transistors includes a differential pair of transistors, and wherein emitters of the NPN differential pair of transistors are connected to a drain of the NMOS transistor, wherein the comparator is an opamp and wherein a negative input is directly coupled to a source of the NMOS transistor, and wherein a drain terminal of said NMOS transistor is connected to a pair of emitters of a differential pair of NPN transistors at a first node.

11. A current mode BiCMOS circuit as defined in claim 10, wherein in operation, the voltage is present at the first node is less than or equal to 0.45 volts.

12. A current mode logic circuit comprising:

input stage having a plurality of bipolar junction NPN differential pairs of transistors coupled to one another and serially coupled to a common NMOS current source comprising an NMOS transistor having a drain, gate and source, the current source being controlled by an opamp having an output terminal coupled to the gate and having an input terminal coupled to the source.

13. A current mode logic circuit as defined in claim 12, wherein the input terminal coupled to the source is a negative input terminal and wherein a positive input terminal is for being coupled to a voltage source.

14. A current mode BiCMOS circuit comprising:

an input stage having a plurality of electrically coupled NPN bipolar junction transistors coupled with a sinking current source for, in use, providing little or no voltage drop therebetween, the current source having an NMOS transistor coupled to a degeneration resistor; and, a control circuit including a comparator for controlling the current that passes through the NMOS transistor.

15. A current mode BiCMOS circuit comprising:

an input stage having a plurality of electrically coupled NPN bipolar junction transistors coupled with a sinking current source having an NMOS transistor coupled to a degeneration resistor; and, a control circuit including a comparator for controlling the current that passes through the NMOS transistor, wherein the plurality of NPN bipolar transistors includes a differential pair of transistors, and wherein emitters of the NPN differential pair of transistors are connected to a drain of the NMOS transistor, wherein the comparator is an opamp and wherein a negative input is directly coupled to a source of the NMOS transistor, and wherein a drain terminal of said NMOS transistor is connected to a pair of emitters of a differential pair of NPN transistors at a first node.

16. A current mode BiCMOS circuit comprising:

an input stage having a plurality of pairs of electrically coupled NPN bipolar junction transistors coupled with a sinking current source for, in use, providing little or no voltage drop therebetween, the current source having an NMOS transistor coupled to a degeneration resistor; and, a control circuit including a comparator for controlling the current that passes through the NMOS transistor.

17. A circuit according to claim 16 wherein the plurality of pairs includes at least 5 pairs.

18. A circuit according to claim 17 wherein the plurality of pairs includes at least 10 pairs.

* * * * *